(12) United States Patent
Hwang

(10) Patent No.: US 6,859,409 B2
(45) Date of Patent: Feb. 22, 2005

(54) SEMICONDUCTOR MEMORY HAVING SENSE AMPLIFIER ARCHITECTURE

(75) Inventor: Sang-Joon Hwang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/617,740

(22) Filed: Jul. 14, 2003

(65) Prior Publication Data

US 2004/0179418 A1 Sep. 16, 2004

(30) Foreign Application Priority Data

Mar. 15, 2003 (KR) ........................................ P2003-16304

(51) Int. Cl.[7] .................................................. G11C 8/00
(52) U.S. Cl. .................................. 365/230.03; 365/196
(58) Field of Search ........................... 365/230.03, 196, 365/207, 230.02

(56) References Cited

U.S. PATENT DOCUMENTS 5,901,102 A * 5/1999 Furutani ..................... 365/226
6,617,885 B2 * 9/2003 Lim et al. .................... 327/57

* cited by examiner

Primary Examiner—Thong Le
(74) Attorney, Agent, or Firm—Harness, Dickey & Pierce, P.L.C.

(57) ABSTRACT

The semiconductor memory device includes a plurality of first data sense amplifiers and a plurality of second data sense amplifiers. Each first data sense amplifier being a voltage sense amplifier, and each first data sense amplifier associated with data lines of a first type, which lead from bit line sense amplifiers. Each second data sense amplifier including a current sense amplifier and a voltage sense amplifier, and each second data sense amplifier associated with data lines of a second type, which lead from bit line sense amplifiers.

30 Claims, 10 Drawing Sheets

//  SEMICONDUCTOR MEMORY HAVING SENSE AMPLIFIER ARCHITECTURE

BACKGROUND OF THE INVENTION

1. Field of the Invention

The present invention relates to a semiconductor memory and the sense amplifier architecture therefore.

2. Description of the Related Art

FIG. 1 illustrates a prior art architecture for a dynamic random access memory (DRAM). As shown, the DRAM 1 includes a plurality of memory banks BANK-1 to BANK-4. Each memory bank BANK-1 to BANK-4 includes a plurality of memory cells MC. A row decoder and column decoder decode an address and enable word lines WL and column select lines CSL to, for example, read data out from the memory cell MC. The data output from the memory cell MC is output to a bit line BL. A bit line sense amplifier BLSA senses (e.g. amplifies) the data value output by the memory cell MC, and outputs the sensed data value on data line DL and complementary data line DLB. A multiplexer MUX1, MUX2, MUX3 and MUX4, associated with a respective one of the memory banks BANK-1 to BANK-4 selectively outputs the data value on the data line DL and complementary data line DLB based on a respectively received bank address BA1–BA4.

Because the size of the BLSAs are small and the data line loading is very large, a data line sense amplifier DSA is used to further amplify the signal on one of the data lines connected to the DSA by one of the multiplexers MUX1–MUX4. Generally, there are two types of DSAs—a voltage sense amplifier VSA and a current sense amplifier CSA. A VSA amplifies a signal to obtain a large voltage swing, and takes a significant amount of time to transition the signal between states. By contrast, when a CSA amplifies a signal less time is taken to transition the signal between states, but the voltage swing is not very large. As such, a CSA has a faster response speed than a VSA, but a VSA produces a greater voltage swing. To obtain the best of both types of amplifiers, the DSA in the prior art architecture of FIG. 1 includes a CSA and VSA.

As shown in FIG. 1, if the number of data pins DQl–DQn is eight, then eight DSAs are provided, which means that eight CSAs are provided. While the response speed of the CSA is greater than a VSA, the CSA consumes a greater amount of power in operation. This disadvantage of CSAs becomes a significant problem for wider data capacity memories because each data pad or data pin (DQ) requires a corresponding CSA.

SUMMARY OF THE INVENTION

In the semiconductor memory device according to the present invention, a current sense amplifier is not provided to produce an amplified signal for each data pin. The semiconductor memory device according to the present invention, includes a plurality of first data sense amplifiers and a plurality of second data sense amplifiers. The first data sense amplifiers are voltage sense amplifiers and the second data sense amplifiers each include a voltage and current sense amplifier. In the semiconductor memory device, the first data sense amplifiers are associated with data lines of a first type leading from bit line sense amplifiers and the second data sense amplifiers are associated with data lines of a second type leading from bit line sense amplifiers.

In one exemplary embodiment, the data lines of the first type are shorter than the data lines of the second type. In another exemplary embodiment, the data lines of the first type have loads which are less than the loads on the data lines of the second type.

In one exemplary embodiment, the first and second data sense amplifiers generate amplified data signals that are supplied to data pads at an edge of the semiconductor memory chip. In another exemplary embodiment, the first and second data sense amplifiers generate amplified data signals that supplied to data pads located along a center of the semiconductor memory chip.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DESCRIPTION OF THE PREFERRED EMBODIMENTS

Figure 1:
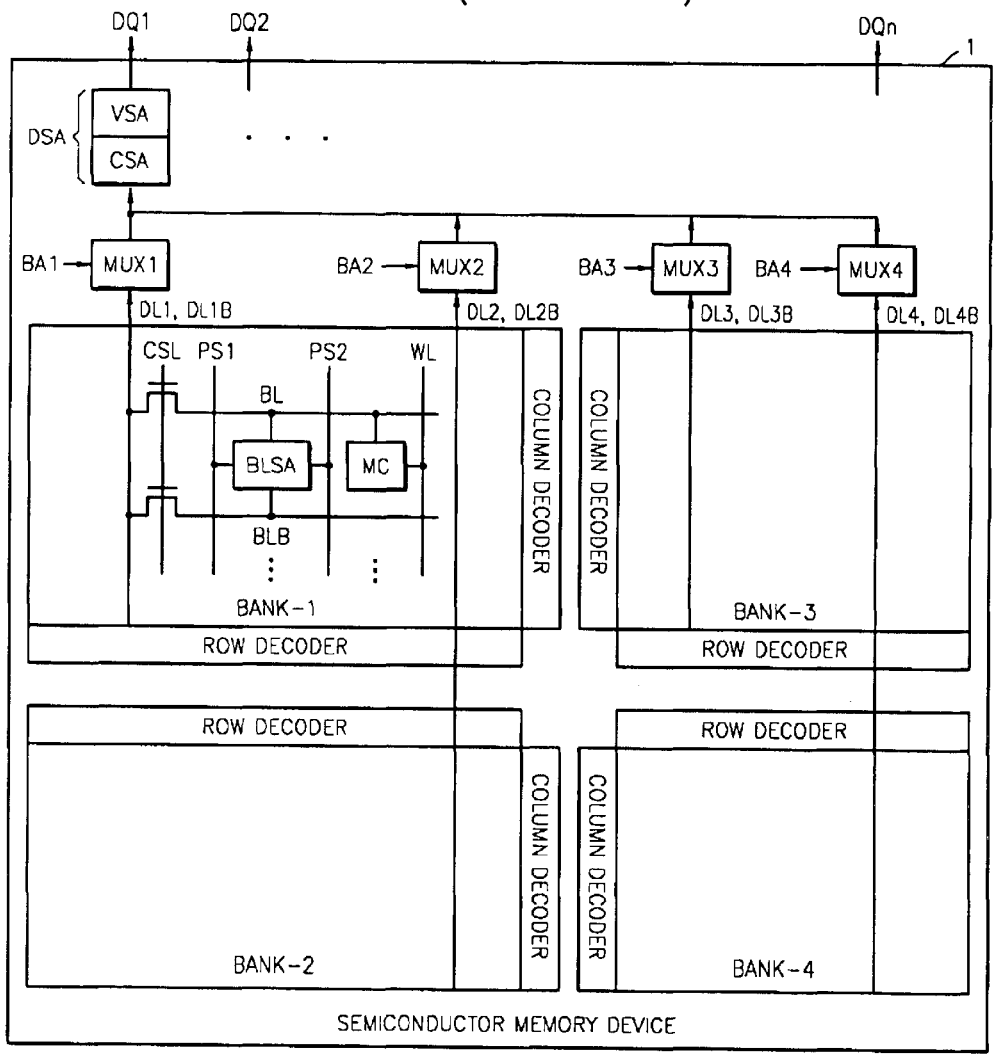
FIG. 1 illustrates a prior art architecture for a dynamic random access memory (DRAM)
Figure 2:
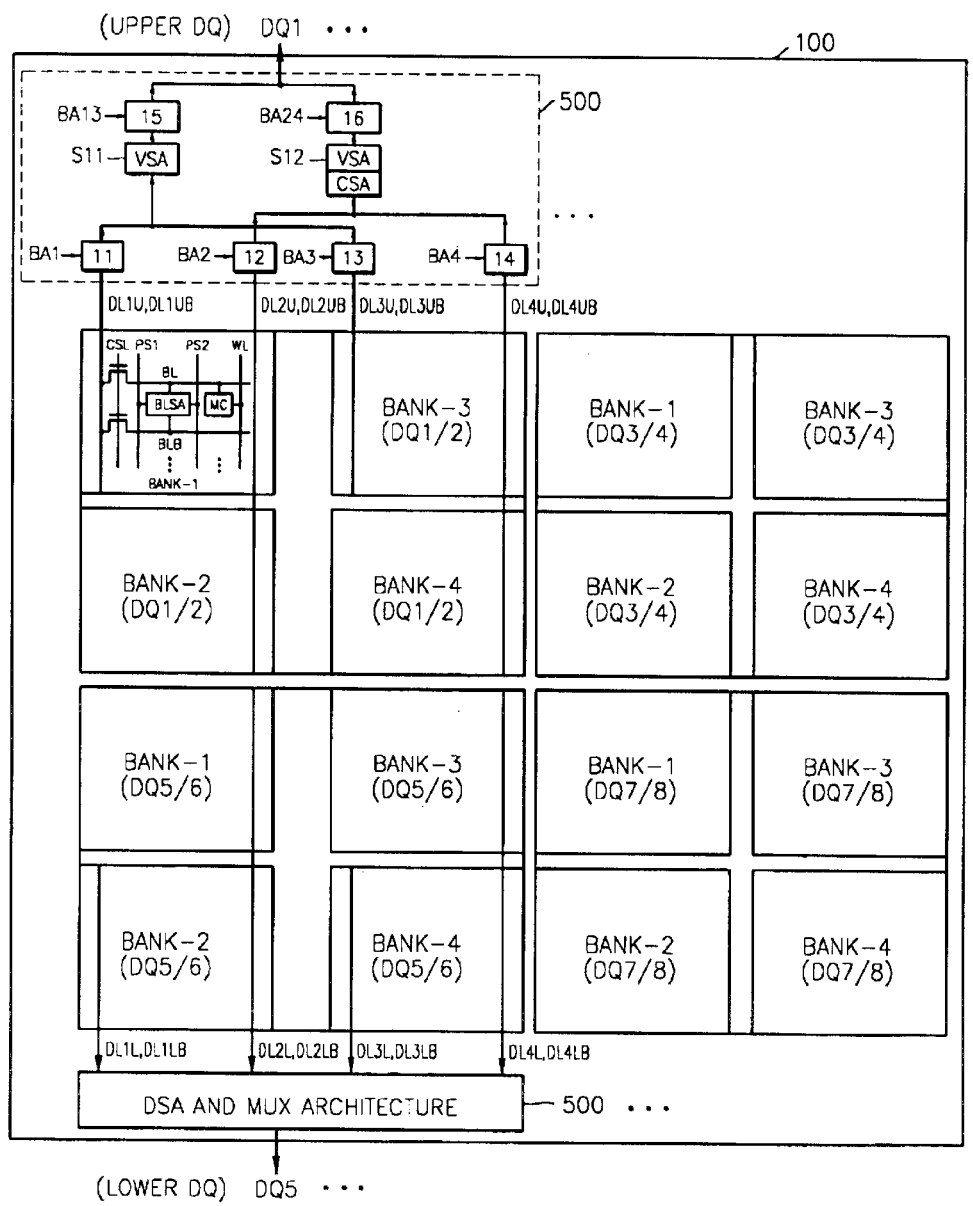
FIG. 2 illustrates an architecture for a dynamic random access memory (DRAM) according to a first embodiment of the present invention.

FIG. 2 illustrates an architecture for a dynamic random access memory (DRAM) according to a first embodiment of the present invention. As shown, the DRAM 100 includes a plurality of memory banks BANK-1 to BANK-4 in each memory block 101. Each memory bank BANK-1 to BANK-4 includes a plurality of memory cells MC. A row decoder and column decoder decode an address and enable word lines WL and column select lines CSL to, for example, read data out from the memory cell MC. The data output from the memory cell MC is output to a bit line BL. A bit line sense amplifier BLSA senses (e.g., amplifies) the data value output by the memory cell, and outputs the sensed data value on data line DL and complementary data line DLB.

As shown in FIG. 2, the data lines DL and DLB from each memory bank BANK-1 to BANK-4 in a memory block 101 lead to an associated data sense amplifier (DSA) and multiplexer (MUX) architecture 500, and the DSA and MUX architecture 500 supplies a signal on the data lines from one of the memory banks BANK-1 to BANK-4 to an associated data pin or data pad DQ at an edge of the DRAM chip 100. As further shown in FIG. 2, the data lines for the first and third memory banks BANK-1 and BANK-3 are substantially shorter than the data lines for the second and fourth memory banks BANK-2 and BANK-4 because of their proximity to the data pin DQ and the DSA and MUX architecture 500. As a result, a greater loading will exist on the data lines for the second and fourth memory banks BANK-2 and BANK-4.

The DSA and MUX architecture 500 includes first-fourth multiplexers 11–14 connected to the data lines from the first-fourth memory banks BANK-1 to BANK-4, respectively. Each multiplexer 11–14 selectively outputs the signal carried on the associated data line based on a respectively received bank address BA1–BA4. The first and third multiplexers 11 and 13 have their output connected to a first DSA S11, and the second and fourth multiplexers 12 and 14 have their output connected to a second DSA S12. The first DSA S11 is formed from a voltage sense amplifier (VSA) only, and the second DSA S12 is formed from a current sense amplifier (CSA) and VSA.

The first DSA S11 amplifies signals carried by the shorter data lines of the first and third memory banks BANK-1 and BANK-3, which are disposed closer to the data pin DQ and the DSA and MUX architecture 500. The second DSA S12 amplifies signals carried by the longer data lines of the second and fourth memory banks BANK-2 and BANK-4, which are disposed farther from the data pads DQ and the DSA and MUX architecture 500. Namely, only a VSA is used to amplify signals carried on the data lines having less loading, and a CSA and a VSA are used to amplify signals carried on data lines having a greater loading.

A fifth multiplexer 15 selectively outputs the amplified signal from the first DSA S11 based on a joint bank address BA13 (i.e., bank address BA1 logically ORed with bank address BA3) to the data pad DQ. A sixth multiplexer 16 selectively outputs the amplified signal from the second DSA S12 based on a joint bank address BA24 (i.e., bank address BA2 logically ORed with bank address BA4) to the same data pad DQ.

Figure 3:
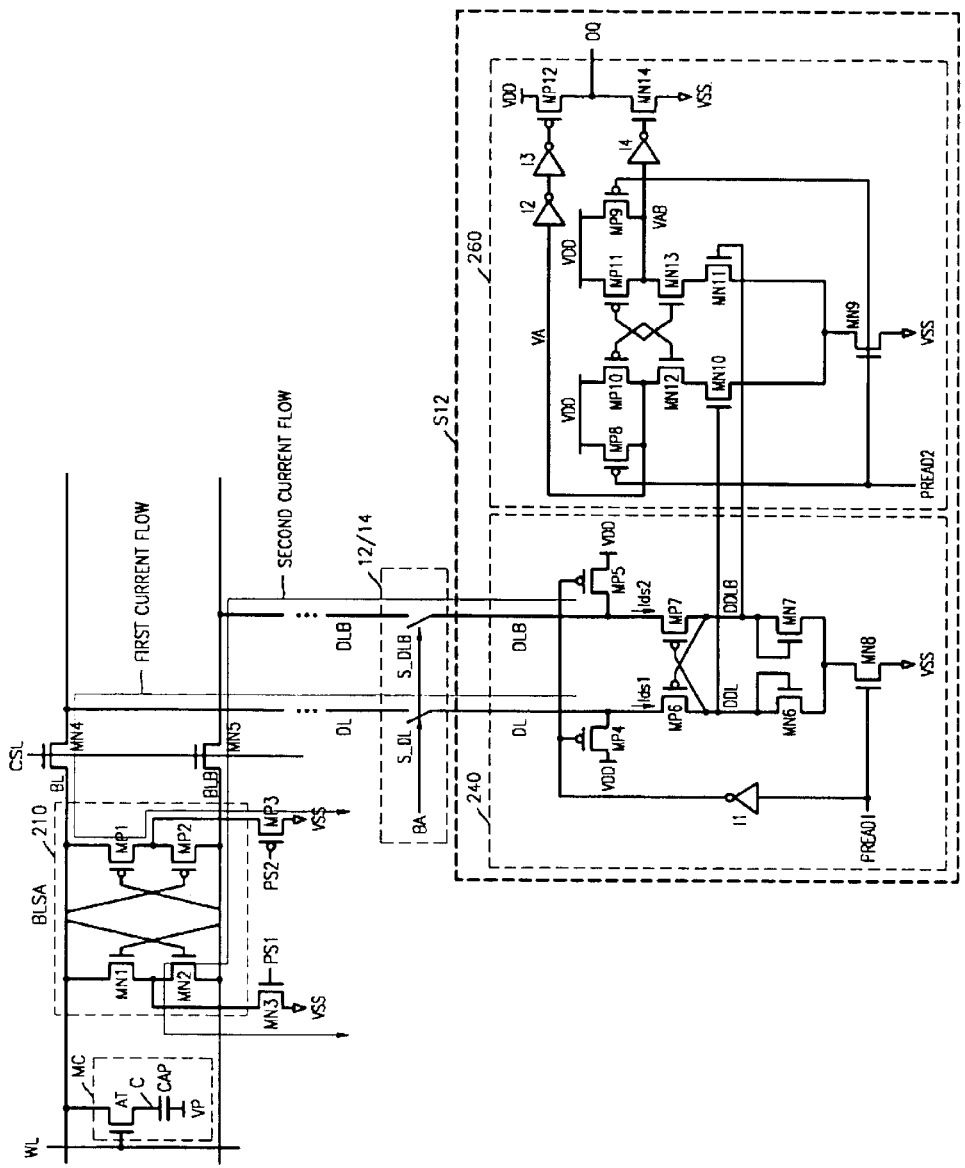
FIG. 3 illustrates a circuit diagram of the DSA formed by a CSA and a VSA in FIG. 2.

FIG. 3 illustrates a circuit diagram of the second DSA S12 of FIG. 2 in conjunction with the memory cell MC and BLSA. A memory cell MC, which includes an access transistor AT and a capacitor CA, stores a bit of data with a logic high or low voltage level. An active command and a row address (not shown) are applied to enable the word line WL. The word line WL enables the memory cell MC. In other words, the access transistor AT is enabled by the word line WL and then the data of cell node C is transferred (=charge shared) to the bit line BL. A bit line sense amplifier BLSA 210 amplifies the transferred data on the bit line BL when sense enable signals PS1, PS2 enable operation of the BLSA 210. Namely, cross-connected first and second NMOS transistors MN1 and MN2 and cross-connected first and second PMOS transistors MP1 and MP2 serve to amplify the voltage difference between the bit and bit bar lines BL and BLB when the sense enable signals PS1 and PS2 enable operation of the BLSA 210. The sense enable signals PS1 and PS2 enable operation of the BLSA 210 by turning on respective third NMOS and PMOS transistors MN3 and MP3, which allows current to flow through the BLSA 210.

When a read command and a column address are applied, the column decoder generates a column select line signal on the column select line CSL. The column select line CSL enables transfer of the data on the bit line BL to a data line DL (and data on the bit bar line BLB to the complementary data line DLB) by turning on fourth and fifth NMOS transistors MN4 and MN5.

According to a bank selection signal BAi (i is a natural number), the first-fourth multiplexers 11–14 are turned on or off. In FIG. 3, only a single multiplexer representing either the first or third multiplexer 12 or 14 has been illustrated. Each of first and third multiplexers 12 and 14 comprises switches S_DL and S_DLB that selectively connect the data and complementary data lines DL and DLB to the DSA S12.

The DSA S12 includes a CSA 240 and a VSA 260. The current and voltage sense amplifiers 240 and 260 use different sensing methods. The CSA 240 senses the current difference of data on a pair of data lines DL and DLB and consequently generates a potential difference between nodes in the data line DL and the complementary data line DLB depending on the current difference. The potential difference between the nodes DL and DLB generates logic levels, which the VSA 260 converts to full swing CMOS voltage levels (VDD to VSS). A large potential difference of the nodes DL and DLB can increase the sensing efficiency in the VSA 260. The outputs of the VSA 260 are transferred to drivers MP12 and MN14 to output to data pin DQ.

As shown, the CSA 240 includes two load transistors MP4, MP5 (fourth and fifth PMOS transistors) and an eighth NMOS transistor MN8 selectively enabling operation of the CSA 240 based on a first read enable signal PREAD 1 (a first inverter I1 inverts the first read enable signal PREAD 1 supplied to the fourth and fifth PMOS transistors MP4 and MP5). The CSA 240 also includes cross-connected sixth and seventh PMOS transistors MP6 and MP7, sixth and seventh NMOS transistors MN6, MN7 connected in series respectively with the sixth and seventh PMOS transistors MP6 and MP7 and the eighth NMOS transistor MN8. The CSA 240 senses and amplifies signals on the data lines DL and DLB.

The current flowing through sixth and seventh PMOS transistors MP6 and MP7 in FIG. 3 are denoted as Ids1 and Ids2. According to the difference between current flows Ids1 and Ids2, the voltage difference between output nodes DDL and DDLB in the CSA 240 is generated (see FIG. 4, which shows an I-V characteristic of a MOS transistor). Respective sixth and seventh PMOS transistors MP6 and MP7 operate differently depending on the current flows Ids1 and Ids2. The specific level of the gate-to-source voltage Vgs are 0.3V and 0.5V, which matches the drain-to-source voltage Vds 0.5V and 0.3V.

A second read enable signal PREAD2 enables operation of the VSA 260 by turning off eighth and ninth PMOS transistors MP8 and MP9 and turning on ninth NMOS transistor MN9. This allows the voltage difference between output nodes DDL and DDLB in the CSA 240 to drive the operation of tenth and eleventh NMOS transistors MN10 and MN11. The tenth and eleventh NMOS transistors MN10 and MN11 drive the voltage amplification to produce (i) an amplified voltage VA at the commonly connected gates of eleventh PMOS transistor MP11 and thirteenth NMOS transistor MN13, which are connected in series with the ninth and tenth MOS transistors MN9 and MN10 between VDD and VSS, and (ii) the complement amplified voltage VAB at the commonly connected gates of tenth PMOS transistor MP10 and twelfth NMOS transistor MN12, which are connected in series with the ninth and eleventh NMOS transistors MN9 and MN11 between VDD and VSS.

The amplified voltage VA is inverted by second and third inverters I2 and I3, and supplied as a drive signal to twelfth PMOS transistor MP12. The complementary amplified voltage VAB is inverted by a fourth inverter 14, and supplied as a drive signal to a fourteenth NMOS transistor MN14. The twelfth PMOS transistor MP12 and fourteenth NMOS transistor MN14 drive the output pad DQ.

Figure 4:
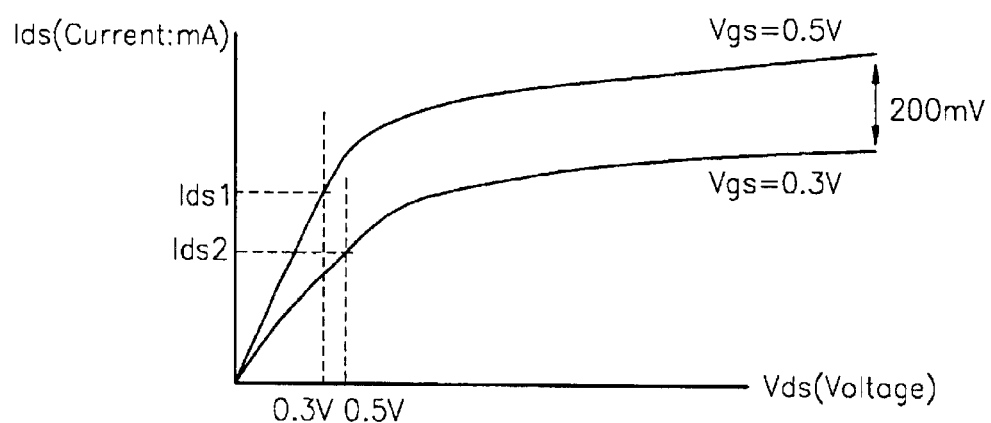
FIG. 4 shows an I-V characteristic of a MOS transistor in t he CSA of FIG. 3.
Figure 5:
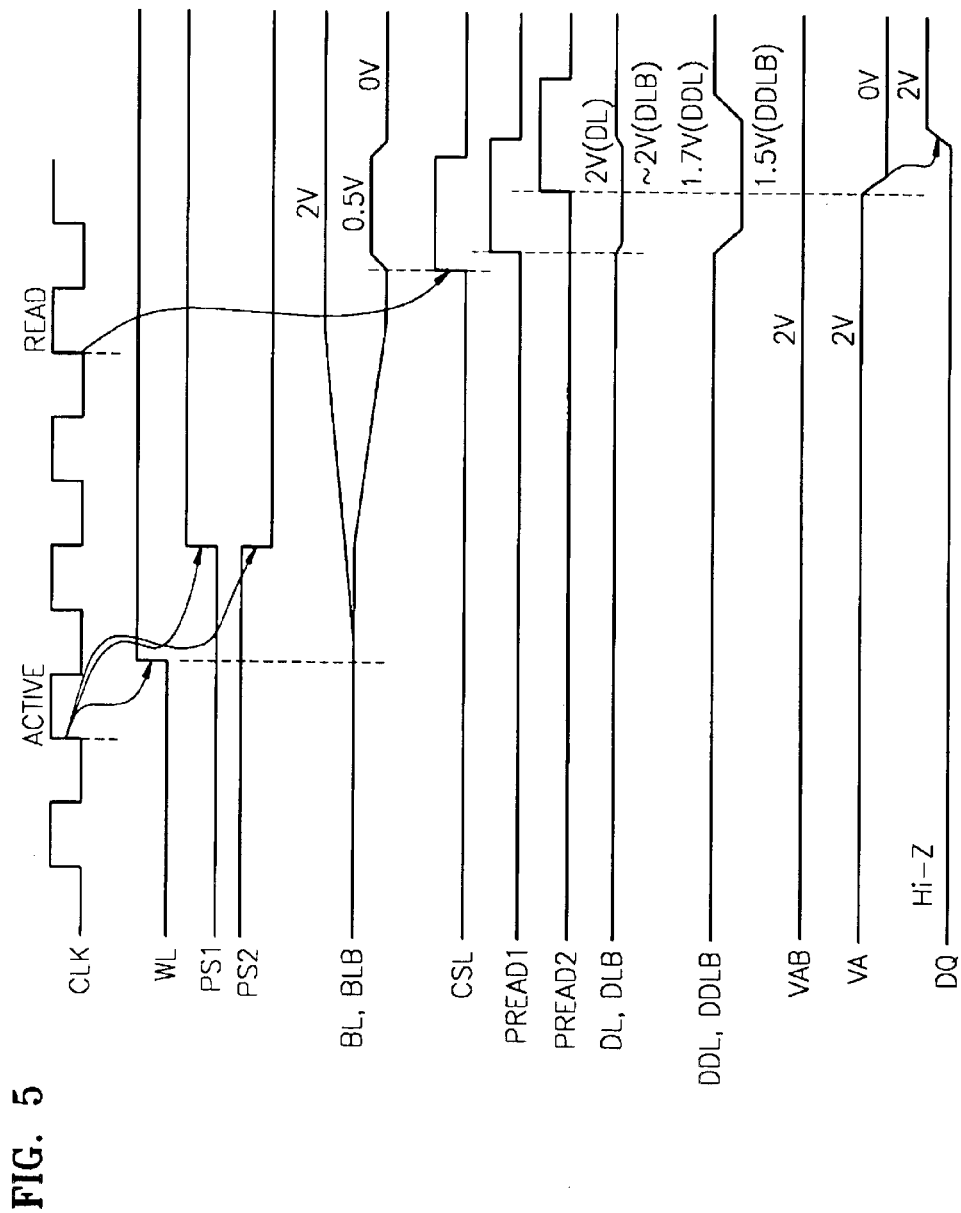
FIG. 5 shows a timing diagram for the DSA of FIG. 3 during a read operation.

FIG. 5 shows a timing diagram of the circuit illustrated in FIG. 3 during a read operation assuming that the memory cell MC stores logic high. When an active command with a row address is applied, the word line signal WL is enabled and then the BLSA enabling signals PS1 and PS2 are enabled to start sensing of corresponding bit lines BL and BLB. Then a read command with a column address is applied, and a column select line CSL is enabled. A voltage jumping 0.5V of the complementary bit line BLB is generated by the current path from the load transistor MP5 to ground voltage VSS via the third NMOS transistor MN3 according to a principle of current sensing. The initial states of the data lines DL and DLB are pre-charged with the power supply voltage VDD. If the column select line CSL is enabled, the data on the data line DL is 2V and the data on the complementary data line DLB is about 1.99V (~2V) assuming the level of the power supply voltage VDD is 2V and the ground voltage level is 0V. The voltage difference between the date lines is very small but the current difference is large as shown in FIG. 4. Each load transistor MP4, MP5 supplies current to the data lines with a power supply voltage VDD. The first current path from the data line DL to the power supply voltage VDD via MOS transistors MN4, MP1 and MP3 is small and the current flow Ids1 through the sixth PMOS transistor MP6 is large. The second current path from the complementary data line DLB to the ground voltage VSS through transistors MN5, MN2 and MN3 is longer than the first current path and the current flow Ids2 through the seventh PMOS transistor MP7 is small. As shown in FIG. 4, the voltage difference between a gate node and a source node of the sixth PMOS transistor MP6 is 0.5V. The difference between a gate node and a source node of the seventh PMOS transistor MP7 is 0.3V. So, the output nodes of the CSA (DDL and DDLB) are 1.7V and 1.5V, respectively. The respective output voltages VAB and VA of the VSA 260 are 2V and 0V in response to the voltage level 1.7V and 1.5V of the output nodes of the CSA 240. The data pin DQ outputs logic high with a voltage level 2V corresponding to the sensed logic level of the memory cell MC.

Figure 6:
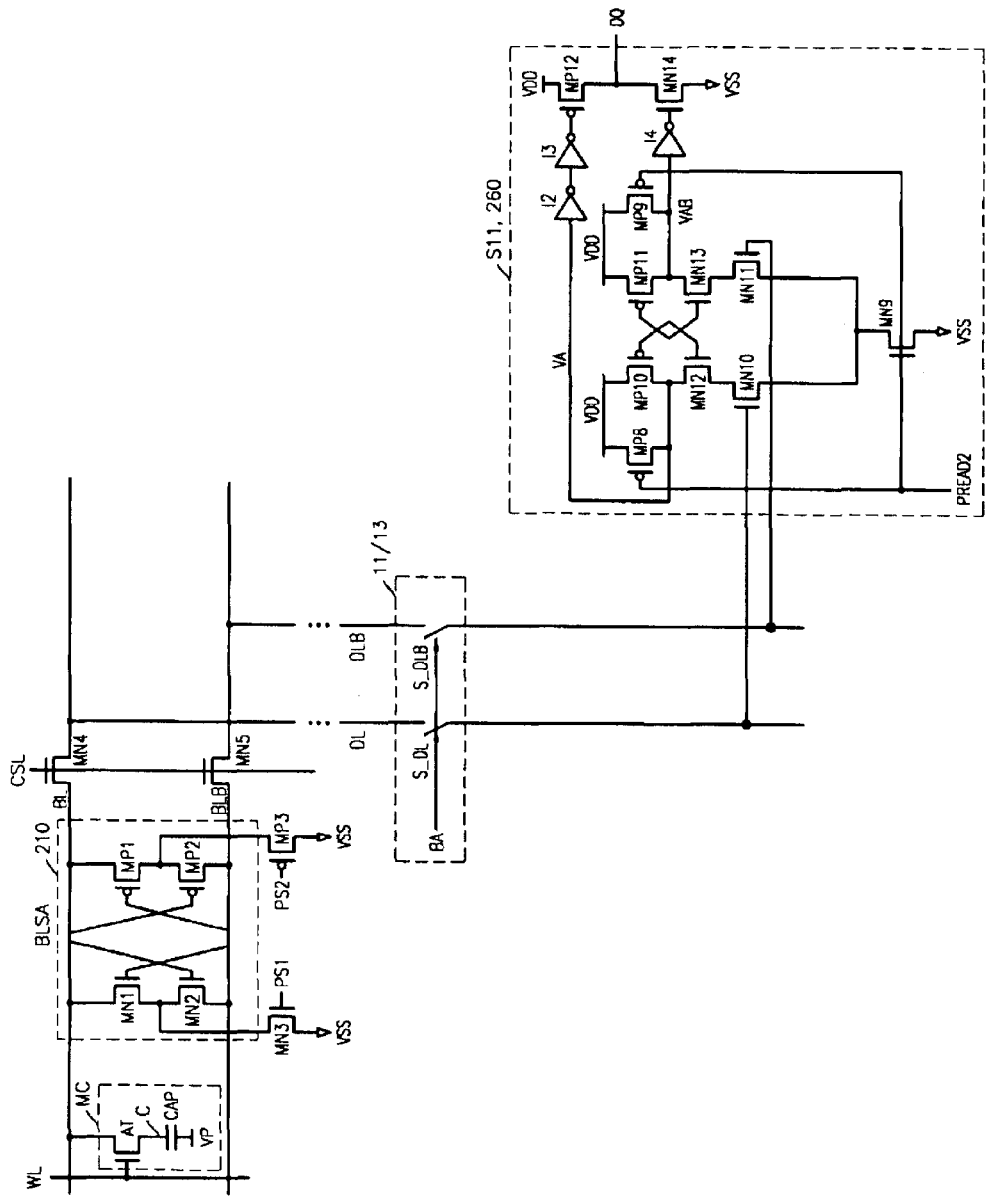
FIG. 6 illustrates a circuit diagram of the DSA formed by a VSA in FIG. 2.
Figure 7:
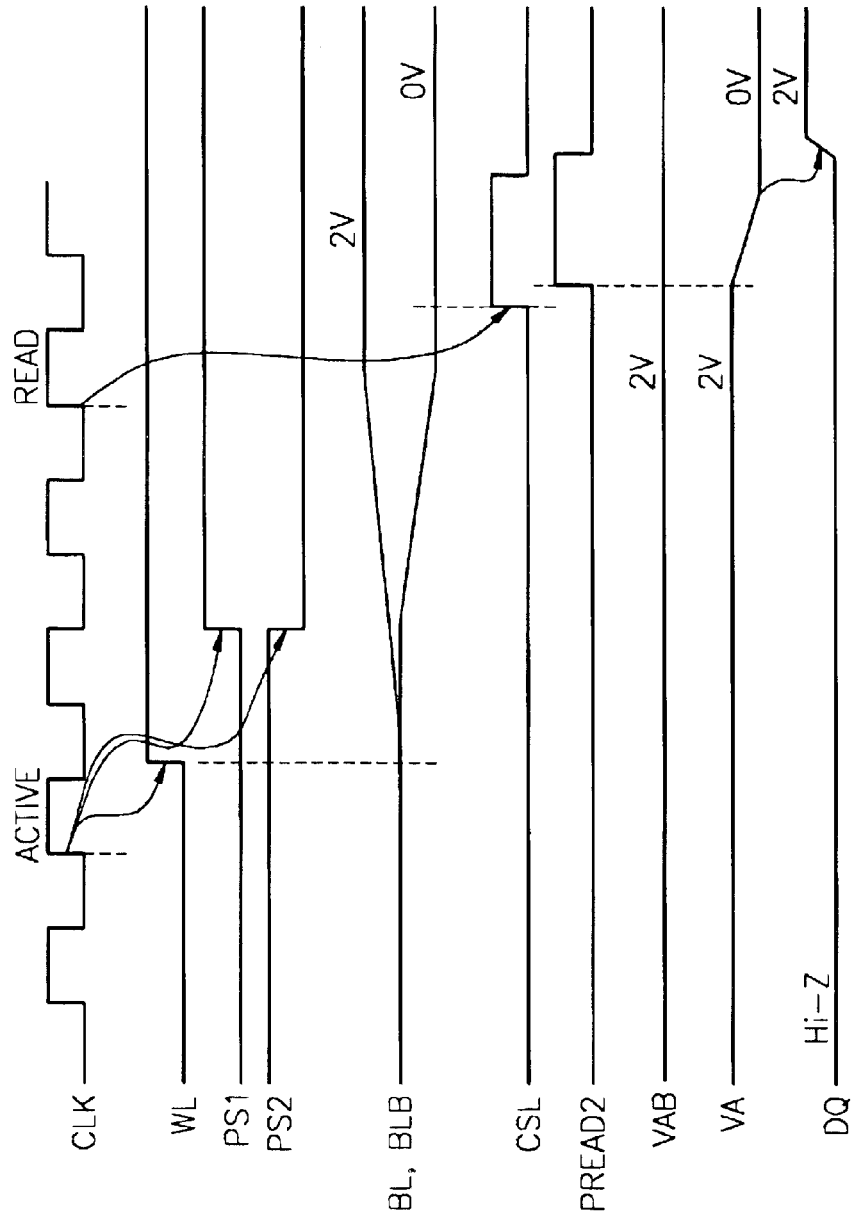
FIG. 7 shows a timing diagram of the DSA of FIG. 6 during a read operation.

FIG. 6 illustrates a circuit diagram of the first DSA S11 of FIG. 2 in conjunction with the memory cell MC and the BLSA. This circuit diagram is the same as the circuit diagram for the second DSA S12 in FIG. 3 except that the CSA 240 has been eliminated. Namely the data line DL and complementary data line DLB are directly connected to the tenth and eleventh NMOS transistors MN10 and MN11. FIG. 7 shows a timing diagram of the circuit illustrated in FIG. 6 during a read operation assuming that the memory cell MC stores logic high and that VDD=2V and VSS=0V. This timing diagram will be readily understood from the description of the timing diagram in FIG. 5 for the circuit diagram of FIG. 3.

Figure 8:
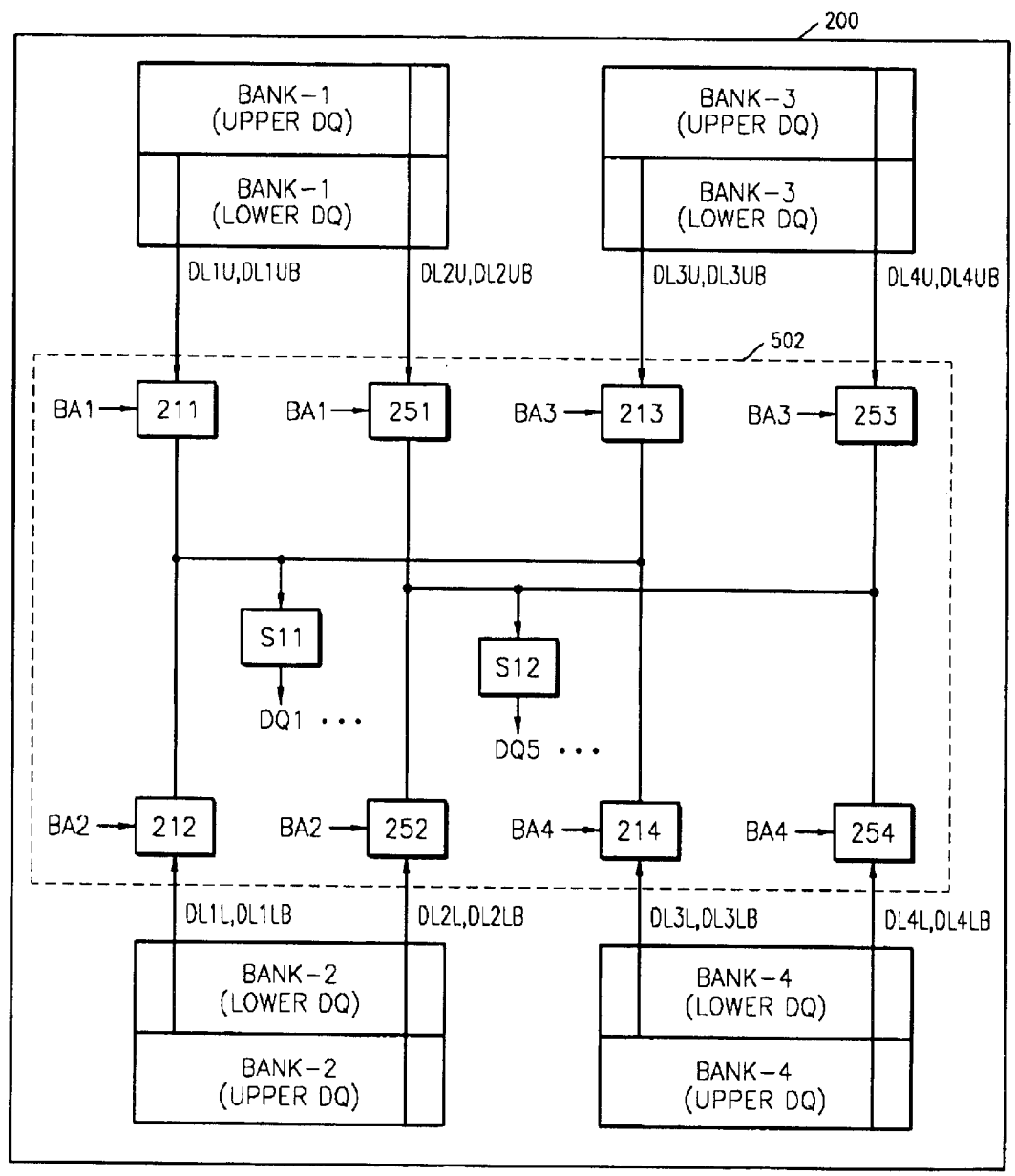
FIG. 8 illustrates an architecture for a dynamic random access memory (DRAM) according to a second embodiment of the present invention.

FIG. 8 illustrates an architecture for a DRAM according to a second embodiment of the present invention. As shown, the DRAM 200 includes a plurality of memory banks BANK-1 to BANK-4. Each memory bank BANK-1 to BANK-4 is divided into an upper and lower portion, and each upper and lower portion has the same structure as the memory banks described in detail with respect to the embodiment of FIG. 2. Accordingly, each upper and lower portion of a memory bank BANK-1 to BANK-4 outputs a sensed data value on a data line DL and complementary data line DLB.

As shown in FIG. 8, the data lines from each upper portion and lower portion of a memory bank BANK-1 to BANK-4 lead to a data DSA and MUX architecture 502, and the DSA and MUX architecture 502 supplies signals on the data lines to data pins or data pads DQ located along a center of the DRAM chip 200. As further shown in FIG. 8, the data lines for the lower portions of the memory banks BANK-1 to BANK-4 are substantially shorter than the data lines for the upper portions of the memory banks BANK-1 to BANK-4 because of their proximity to the data pins DQ and the DSA and MUX architecture 502. As a result, a greater loading will exist on the data lines for the upper portions of the memory banks BANK-1 to BANK-4.

The DSA and MUX architecture 502 includes first-fourth lower multiplexers 211–214 connected to the data lines from the lower portions of the first-fourth memory banks BANK-1 to BANK-4, respectively. Each lower multiplexer 211–214 selectively outputs the signal carried on the associated data line based on a respectively received bank address BA1–BA4. The first-fourth lower multiplexers 211–214 have their outputs connected to a first DSA S11, which supplies the amplified signal to a data pin DQ.

The DSA and MUX architecture 502 further includes first-fourth upper multiplexers 251–254 connected to the data lines from the upper portions of the first-fourth memory banks BANK-1 to BANK-4, respectively. Each upper multiplexer 251–254 selectively outputs the signal carried on the associated data line based on a respectively received bank address BA1–BA4. The first-fourth upper multiplexers 251–254 have their outputs connected to a second DSA S12, which supplies the amplified signal to a data pin DQ.

The first DSA S11 is formed from a voltage sense amplifier (VSA) only, and the second DSA S12 is formed from a current sense amplifier (CSA) and VSA. The first and second DSAs S11 and S12 have the same structure as described above with respect to the embodiment of FIG. 2.

The first DSA S11 amplifies signals carried by the shorter data lines of the lower portions of the first-fourth memory banks BANK-1 to BANK-4, which are disposed closer to the data pins DQ and the DSA and MUX architecture 502. The second DSA S12 amplifies signals carried by the longer data lines of the upper portions of the first-fourth memory banks BANK-1 to BANK-4, which are disposed farther from the data pads DQ and the DSA and MUX architecture 502. Namely, only a VSA is used to amplify signals carried on the data lines having less loading, and a CSA and a VSA are used to amplify signals carried on data lines having a greater loading.

Figure 9:
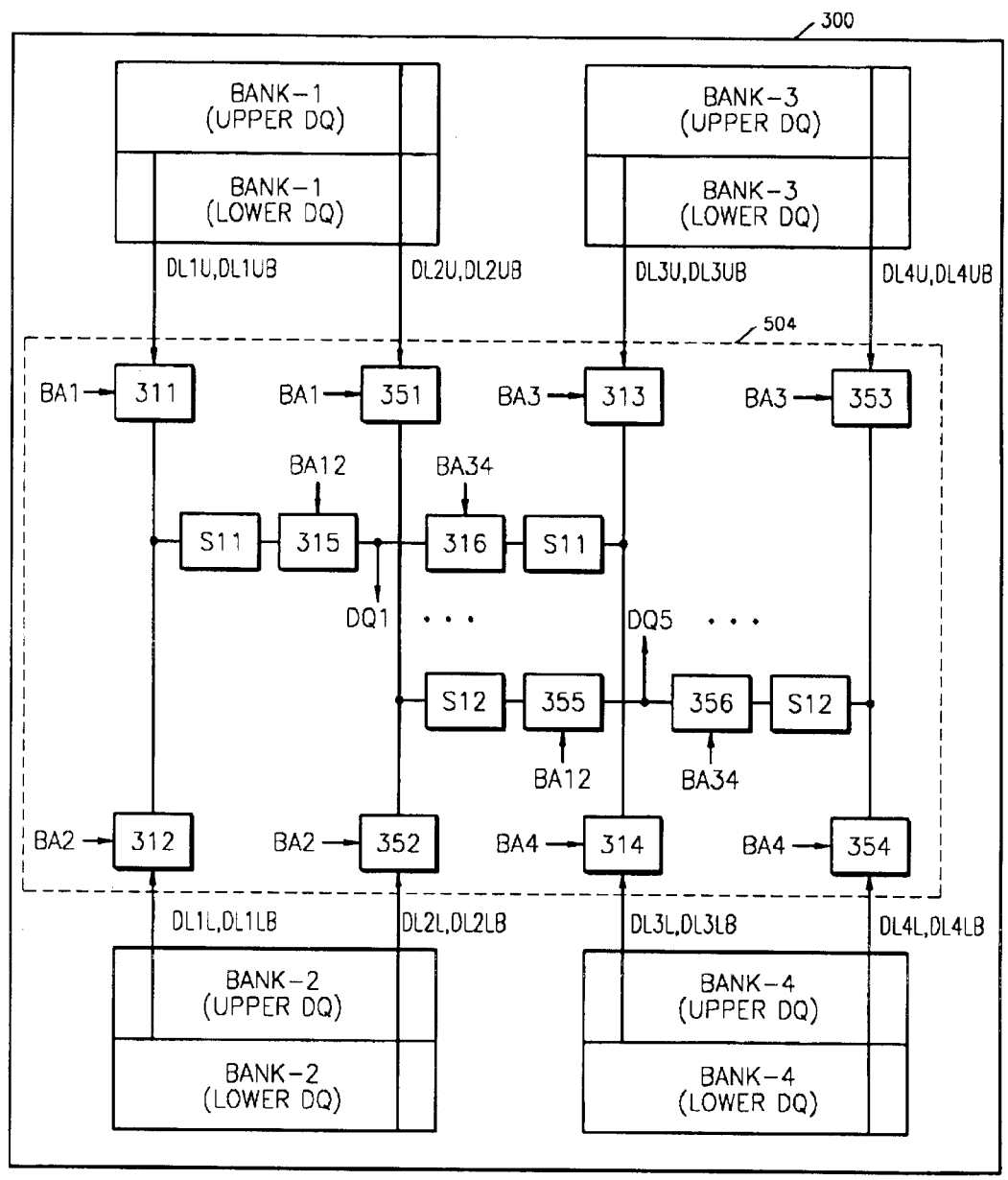
FIG. 9 illustrates an architecture for a dynamic random access memory (DRAM) according to a third embodiment of the present invention.

FIG. 9 illustrates an architecture for a DRAM according to a third embodiment of the present invention. As shown, the DRAM 300 includes a plurality of memory banks BANK-1 to BANK-4. Each memory bank BANK-1 to BANK-4 is divided into an upper and lower portion, and each upper and lower portion has the same structure as the memory banks described in detail with respect to the embodiment of FIG. 2. Accordingly, each upper and lower portion of a memory bank BANK-1 to BANK-4 outputs a sensed data value on a data line DL and complementary data line DLB.

As shown in FIG. 9, the data lines from each upper portion and lower portion of a memory bank BANK-1 to BANK-4 lead to a data DSA and MUX architecture 504, and the DSA and MUX architecture 504 supplies signals on the data lines to data pins or data pads DQ located along a center of the DRAM chip 300. As further shown in FIG. 9, the data lines for the lower portions of the memory banks BANK-1 to BANK-4 are substantially shorter than the data lines for the upper portions of the memory banks BANK-1 to BANK-4 because of their proximity to the data pins DQ and the DSA and MUX architecture 504. As a result, a greater loading will exist on the data lines for the upper portions of the memory banks BANK-1 to BANK-4.

The DSA and MUX architecture 504 includes first-fourth lower multiplexers 311–314 connected to the data lines from the lower portions of the first-fourth memory banks BANK-1 to BANK-4, respectively. Each lower multiplexer 311–314 selectively outputs the signal carried on the associated data line based on a respectively received bank address BA1–BA4. The first-second lower multiplexers 311–312 have their outputs connected to a first DSA S11, which supplies the amplified signal to a first joint multiplexer 315. The first joint multiplexer 315 selectively outputs the amplified signal to an output pin DQ based on a joint bank address BA12 (i.e., bank address BA1 logically ORed with bank address BA2). The third and fourth lower multiplexers 313–314 have their outputs connected to another first DSA S11, which supplies the amplified signal to a second joint multiplexer 316. The second joint multiplexer 316 selectively outputs the amplified signal to the same output pin DQ as the first joint multiplexer 315 based on a joint bank address BA34 (i.e. bank address BA3 logically ORed with bank address BA4).

The DSA and MUX architecture 504 further includes first-fourth upper multiplexers 351–354 connected to the data lines from the upper portions of the first-fourth memory banks BANK-1 to BANK-4, respectively. Each upper multiplexer 351–354 selectively outputs the signal carried on the associated data line based on a respectively received bank address BA1–BA4. The first-second upper multiplexers 351-352 have their outputs connected to a second DSA S12, which supplies the amplified signal to a third joint multiplexer 355. The third joint multiplexer 355 selectively outputs the amplified signal to an output pin DQ based on a joint bank address BA12 (i.e., bank address BA1 logically ORed with bank address BA2). The third and fourth upper multiplexers 353–354 have their outputs connected to another second DSA S12, which supplies the amplified signal to a fourth joint multiplexer 356. The fourth joint multiplexer 356 selectively outputs the amplified signal to the same output pin DQ as the third joint multiplexer 355 based on a joint bank address BA34 (i.e., bank address BA3 logically ORed with bank address BA4).

The first DSA S11 is formed from a voltage sense amplifier (VSA) only, and the second DSA S12 is formed from a current sense amplifier (CSA) and VSA. The first and second DSAs S11 and S12 have the same structure as described above with respect to the embodiment of FIG. 2.

The first DSA S11 amplifies signals carried by the shorter data lines of the lower portions of the first-fourth memory banks BANK-1 to BANK-4, which are disposed closer to the data pins DQ and the DSA and MUX architecture 504. The second DSA S12 amplifies signals carried by the longer data lines of the upper portions of the first-fourth memory banks BANK-1 to BANK-4, which are disposed farther from the data pads DQ and the DSA and MUX architecture 504. Namely, only a VSA is used to amplify signals carried on the data lines having less loading, and a CSA and a VSA are used to amplify signals carried on data lines having a greater loading.

Figure 10:
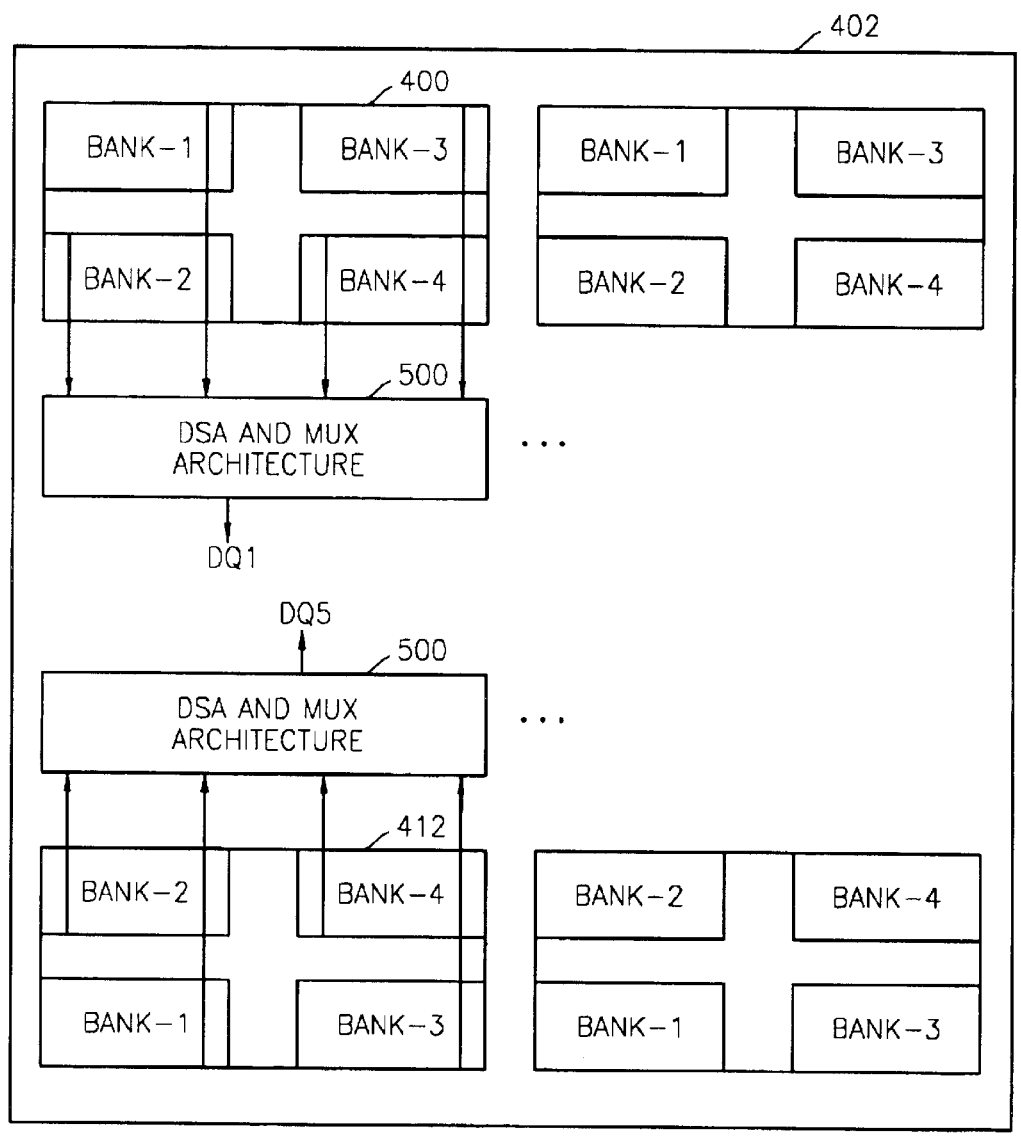
FIG. 10 illustrates an architecture for a dynamic random access memory (DRAM) according to a fourth embodiment of the present invention.

FIG. 10 illustrates an architecture for a dynamic random access memory (DRAM) according to a fourth embodiment of the present invention. The embodiment of FIG. 10 is the same as the embodiment of FIG. 2, except that the data pads DQ are disposed along a center of the semiconductor memory device.

In the above-described embodiments, typically only a single memory block of memory banks is Illustrated along with a single DSA and MUX architecture. However, it will be understood that a semiconductor memory device (e.g., DRAM) according to the present invention may include numerous blocks and DSA and MUX architectures depending on the size of the semiconductor memory device and the number of data pads DQ.

As apparent from the forgoing description, the semiconductor memory device according to the present invention does not provide a CSA in association with each data pad. Namely, each implementation of a DSA in the present invention does not include a CSA. As a result, the semiconductor memory device according to the present invention has reduced power consumption.

While the invention has been disclosed with respect to a limited number of embodiments, those skilled in the art, having the benefit of this disclosure, will appreciate numerous modifications and variations there from. It is intended that all such modifications and variations fall within the spirit and scope of the invention.

What is claimed is:

1. A semiconductor memory device, comprising:
   a plurality of first data sense amplifiers, each first data sense amplifier being a voltage sense amplifier, each first data sense amplifier associated with first data lines, the first data lines leading from a bit line sense amplifier; and
   a plurality of second data sense amplifiers, each second data sense amplifier including a current sense amplifier and a voltage sense amplifier, each second data sense amplifier associated with second data lines, the second data lines leading from a bit line sense amplifier.

2. The device of claim 1, wherein the first data lines have lengths which are less than lengths of the second data lines.

3. The device of claim 1, wherein the first data lines have loads which are less than loads of the second data lines.

4. The device of claim 1, further comprising:
   a plurality of memory banks, a first set of the plurality of memory banks disposed closer to data pads of the semiconductor memory device than a second set of the plurality of memory banks, the first set of the plurality of memory banks associated with the first data lines, and the second set of the plurality of memory banks associated with the second data lines.

5. The device of claim 4, wherein the first data lines have lengths which are less than lengths of the second data lines.

6. The device of claim 4, wherein the data lines of the first type have loads which are less than loads of the data lines of the second type.

7. The device of claim 4, wherein the data pads are located at a chip edge of the semiconductor memory device.

8. The device of claim 4, wherein the data pads are located substantially along a center of the chip of the semiconductor memory device.

9. The device of claim 4, further comprising:
   a first multiplexer associated with each memory bank in the first set and the first multiplexer for selectively connecting the first data line associated with the memory bank to one of the first data sense amplifiers;
   a second multiplexer associated with each memory bank in the second set for selectively connecting the second data line associated with the memory bank to one of the second data sense amplifiers; and a third multiplexer associated with each of the first data sense amplifiers for selectively connecting the first data sense amplifier to one of the data pads; and a fourth multiplexer associated with each of the second data sense amplifiers for selectively connecting the second data sense amplifier to one of the data pads.

10. The device of claim 9, wherein the first data lines have lengths which are less than lengths of the second data lines.

11. The device of claim 9, wherein the first data lines have loads which are less than loads of the second data lines.

12. The device of claim 9, wherein the data pads are located at a chip edge of the semiconductor memory device.

13. The device of claim 9, wherein the data pads are located substantially along a center of the chip of the semiconductor memory device.

14. The device of claim 1, further comprising:

a plurality of memory banks, a first portion of each memory bank disposed closer to data pads of the multi-bank semiconductor memory device than a second portion of each memory bank, the first portions associated with the first data lines, and the second portions associated with the second data lines.

15. The device of claim 14, wherein the first data lines have lengths which are less than lengths of the second data lines.

16. The device of claim 14, wherein the first data lines have lengths which are less than lengths of the second data lines such that output time from first and second data sense amplifiers is substantially the same.

17. The device of claim 14, wherein the first data lines have loads which are less than loads of the second data lines.

18. The device of claim 14, wherein the data pads are located substantially along a center of the chip of the semiconductor memory device.

19. The device of claim 14, further comprising:

a first multiplexer associated with each first portion for selectively connecting the first data line associated with the first portion to one of the first data sense amplifiers;

a second multiplexer associated with each second portion for selectively connecting the second data line associated with the second portion to one of the second data sense amplifiers; and a third multiplexer associated with each of the first data sense amplifiers for selectively connecting the first data sense amplifier to one of the data pads; and a fourth multiplexer associated with each of the second data sense amplifiers for selectively connecting the second data sense amplifier to one of the data pads.

20. The device of claim 19, wherein the first data lines have lengths which are less than lengths of the second data lines.

21. The device of claim 19, wherein the first data lines have loads which are less than loads of the second data lines.

22. The device of claim 19, wherein the data pads are located at a chip edge of the semiconductor memory device.

23. The device of claim 19, wherein the data pads are located substantially along a center of the chip of the semiconductor memory device.

24. The device of claim 14, further comprising:

first and second multiplexers associated with one of the first data sense amplifiers, the first multiplexer associated with one of the first portions and the first multiplexer for selectively connecting the first data line associated with the first portion to the associated first data sense amplifier, the second multiplexer associated with a different one of the first portions and the second multiplexer for selectively connecting the first data line associated with the different first portion to the associated first data sense amplifier; and third and fourth multiplexers associated with one of the second data sense amplifiers, the third multiplexer associated with one of the second portions and the third multiplexer for selectively connecting the second data line associated with the second portion to the associated second data sense amplifier, the fourth multiplexer associated with a different one of the second portions and the fourth multiplexer for selectively connecting the second data line associated with the different second portion to the associated second data sense amplifier.

25. The device of claim 24, wherein the first data lines have lengths which are less than lengths of the second data lines.

26. The device of claim 24, wherein the first data lines have loads which are less than loads of the second data lines.

27. The device of claim 24, wherein the data pads are located substantially along a center of the chip of the semiconductor memory device.

28. A semiconductor memory device, comprising:

a first plurality of data lines;

a second plurality of data lines, the second plurality of data lines having lengths which are greater than lengths of the first plurality of data lines;

a least one first data sense amplifier associated with the first plurality of data lines, each first data sense amplifier being a voltage sense amplifier; and at least one second data sense amplifier associated with the second plurality of data lines, each second data sense amplifier including a current sense amplifier and a voltage sense amplifier.

29. The device of claim 28, wherein the first plurality of data lines have loads which are less than loads of the second plurality of data lines.

30. A semiconductor memory device, comprising:

a plurality of first data sense amplifiers, each first data sense amplifier being a voltage sense amplifier, each first data sense amplifier associated with first data lines, the first data lines leading from a first group of bit line sense amplifiers; and a plurality of second data sense amplifiers, each second data sense amplifier including a current sense amplifier and a voltage sense amplifier, each second data sense amplifier associated with second data lines, the second data lines leading from a second group of bit line sense amplifiers.

* * * * *